US 11,744,031 B2

(12) United States Patent
Wilz et al.

(10) Patent No.: US 11,744,031 B2
(45) Date of Patent: Aug. 29, 2023

(54) PEDESTAL FOR A TABLETOP RETROFIT REMOTE CONTROL DEVICE

(71) Applicant: Lutron Technology Company LLC, Coopersburg, PA (US)

(72) Inventors: Aaron J. Wilz, Emmaus, PA (US); JordanRose M. Mack, Bethlehem, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 273 days.

(21) Appl. No.: 17/186,991

(22) Filed: Feb. 26, 2021

(65) Prior Publication Data

US 2021/0274668 A1    Sep. 2, 2021

Related U.S. Application Data

(60) Provisional application No. 62/983,170, filed on Feb. 28, 2020.

(51) Int. Cl.
*H05K 5/02*       (2006.01)
*G08C 17/02*   (2006.01)
*H05K 5/00*       (2006.01)

(52) U.S. Cl.
CPC ........... *H05K 5/0234* (2013.01); *G08C 17/02* (2013.01); *H05K 5/0017* (2013.01)

(58) Field of Classification Search
CPC .... H05K 5/0017; H05K 5/0234; G08C 17/02; H05B 47/175; H05B 47/19; H02G 3/088; H02G 3/10; H02G 3/123; H02G 3/14; H02G 3/22
See application file for complete search history.

(56) References Cited

U.S. PATENT DOCUMENTS

| 7,242,150 | B2 | 7/2007 | DeJonge et al. |
| 7,546,473 | B2 | 6/2009 | Newman |
| 8,009,042 | B2 | 8/2011 | Steiner et al. |
| 8,330,638 | B2 | 12/2012 | Altonen et al. |
| 8,451,166 | B2 | 5/2013 | Gayrard et al. |
| 8,664,881 | B2 | 3/2014 | Newman, Jr. et al. |
| 2008/0111491 | A1 | 5/2008 | Spira |
| 2017/0278383 | A1 | 9/2017 | Dimberg et al. |
| 2017/0354021 | A1* | 12/2017 | Dimberg ................ G05B 15/02 |

(Continued)

FOREIGN PATENT DOCUMENTS

| EP | 3445137 A1 | 2/2019 |
| WO | 2020028224 A1 | 2/2020 |

*Primary Examiner* — Orlando Bousono
(74) *Attorney, Agent, or Firm* — Flaster Greenberg, P.C.

(57) ABSTRACT

A base may be configured to be attached to a pedestal. The pedestal may include a top plate, a bottom plate, and a mounting tab. The bottom plate may be configured to rest on a horizontal surface. The mounting tab may extend from the top plate (e.g., a platform on the top plate). The mounting tab may be configured to extend into an opening defined by the base. The mounting tab may be configured to prevent rotation of the base of the remote control device when the base is attached to the pedestal. The bottom plate may include a concave bottom surface. The concave bottom surface may include a recessed portion and a flat portion. The flat portion may be along an outer perimeter of the bottom plate. The flat portion may be configured to rest on the horizontal surface.

12 Claims, 10 Drawing Sheets

(56) References Cited

U.S. PATENT DOCUMENTS

| | | | |
|---|---|---|---|
| 2017/0354022 A1* | 12/2017 | Dimberg | H03K 17/962 |
| 2017/0354023 A1* | 12/2017 | Dimberg | G05G 1/105 |
| 2018/0110114 A1* | 4/2018 | Karc | H05B 47/19 |
| 2018/0116039 A1* | 4/2018 | Harte | H05B 47/17 |
| 2018/0246273 A1* | 8/2018 | McDonald | H05B 47/19 |
| 2019/0019403 A1* | 1/2019 | Dimberg | H01H 35/02 |
| 2019/0037674 A1* | 1/2019 | Swatsky | H05B 47/10 |
| 2021/0013706 A1 | 1/2021 | Richter et al. | |

* cited by examiner

PEDESTAL FOR A TABLETOP RETROFIT REMOTE CONTROL DEVICE

This application claims the benefit of Provisional U.S. Patent Application No. 62/983,170, filed Feb. 28, 2020, the disclosure of which is incorporated herein by reference in its entirety.

BACKGROUND

A user environment, such as a residence or an office building for example, may be configured using various types of load control systems. A lighting control system may be used to control the lighting loads in the user environment. A motorized window treatment control system may be used to control the natural light provided to the user environment. A heating, ventilation, and air-conditioning (HVAC) system may be used to control the temperature in the user environment. Each load control system may include various control devices, including control-source devices and control-target devices. The control-target devices may receive digital messages, which may include load control instructions, for controlling an electrical load from one or more of the control-source devices. The control-target devices may be capable of directly controlling an electrical load. The control-source devices may be capable of indirectly controlling the electrical load via the control-target device. Examples of control-target devices may include lighting control devices (e.g., a dimmer switch, an electronic switch, a ballast, or a light-emitting diode (LED) driver), a motorized window treatment, a temperature control device (e.g., a thermostat), an AC plug-in load control device, and/or the like. Examples of control-source devices may include remote control devices, occupancy sensors, daylight sensors, temperature sensors, and/or the like.

SUMMARY

As described herein, a remote control device may be configured to be placed on a horizontal surface (e.g., such as a tabletop, a desk, a counter, etc.). The remote control device may include a base and a rotating portion. The rotating portion may rotate with respect to the base. The remote control device may be configured to control a load control device of a load control system for controlling an amount of power delivered to an electrical load (e.g., to control an intensity of a lighting load). As the rotating portion is rotated, the remote control device may cause the load control device to adjust the amount of power delivered to the electrical load.

The base may be configured to be attached to a pedestal. The pedestal may include a top plate and a bottom plate. The bottom plate may be configured to rest on the horizontal surface. The bottom plate may include a concave bottom surface. The concave bottom surface may include a recessed portion and a flat portion. The flat portion may be along an outer perimeter of the bottom plate. The flat portion may be configured to rest on the horizontal surface. In addition, the pedestal may include a mounting tab that may extend from the top plate (e.g., a platform on the top plate). The mounting tab may be configured to extend into an opening defined by the base. The mounting tab may be configured to prevent rotation of the base of the remote control device when the base is attached to the pedestal.

DETAILED DESCRIPTION

Figure 1:
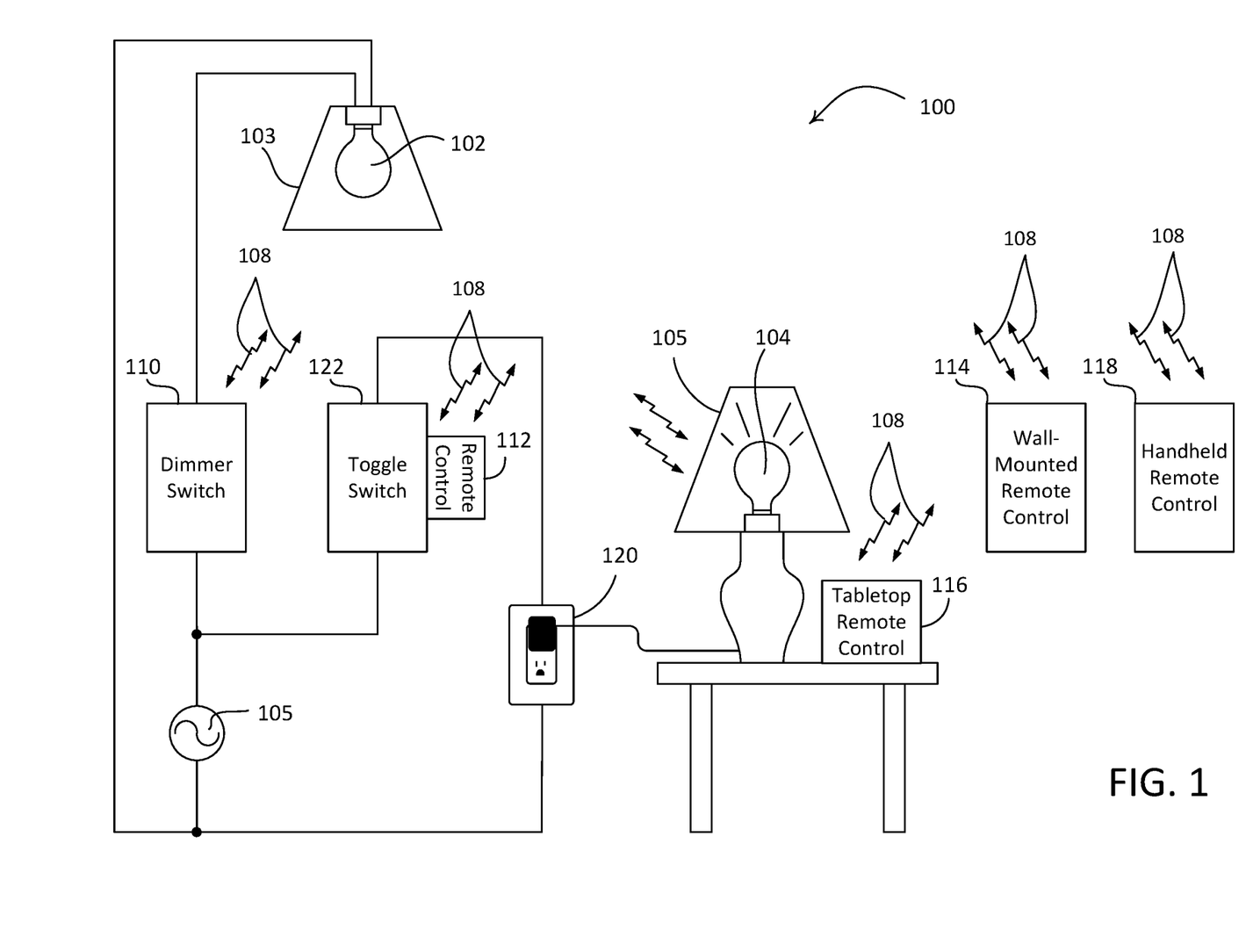
FIG. 1 depicts an example load control system that includes one or more example control devices.
Figure 2:
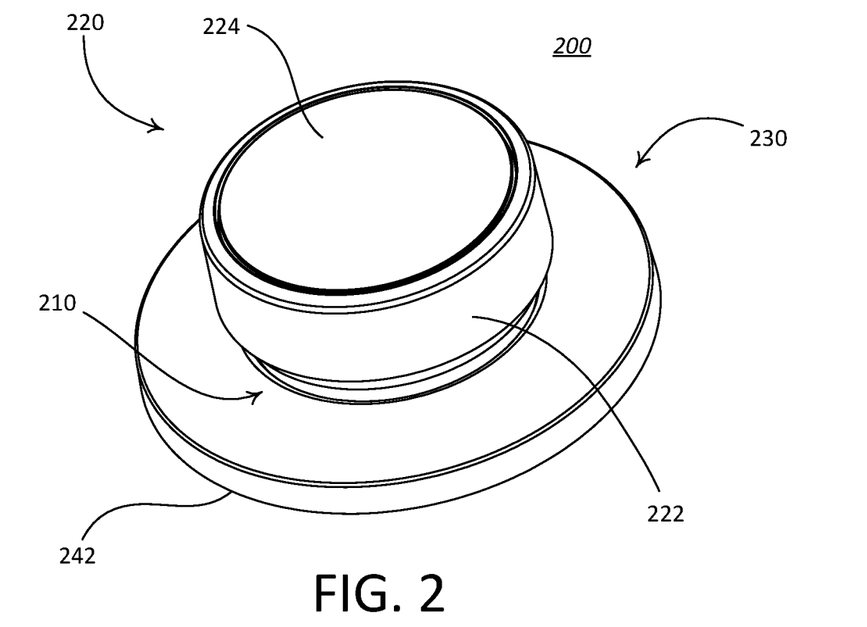
FIG. 2 is a perspective view of an example remote control device that may be deployed as a dimmer switch of the load control system illustrated in FIG. 1.
Figure 3:
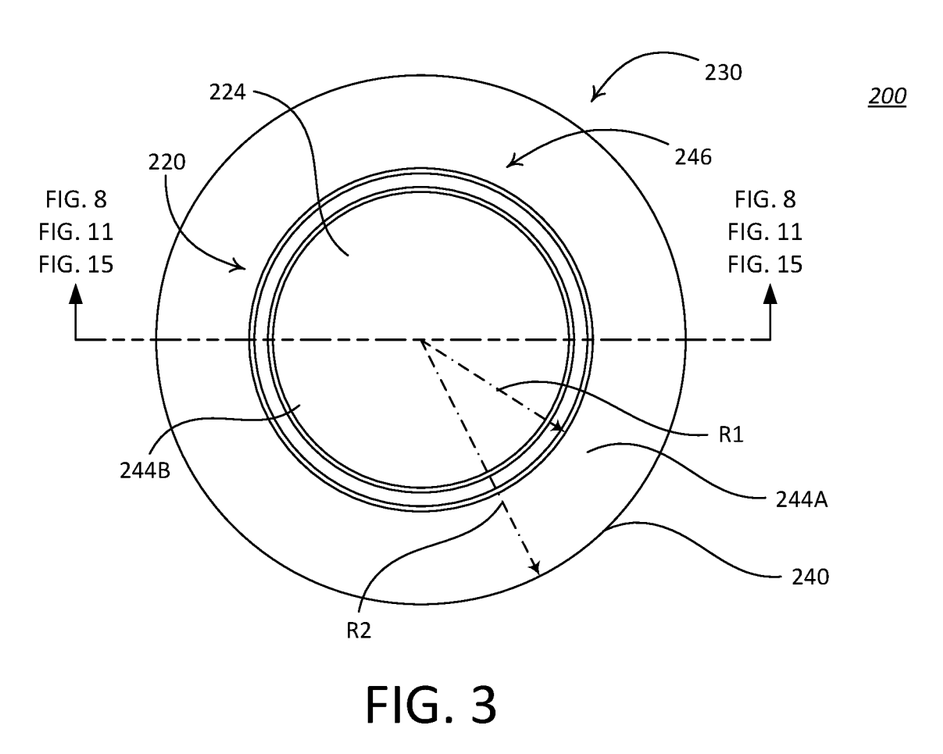
FIG. 3 is a front view of the example remote control device of FIG. 2.

FIG. 1 is a simplified block diagram of an example load control system. As shown, the load control system is configured as a lighting control system 100 for control of one or more lighting loads, such as a lighting load 102 that is installed in a ceiling-mounted downlight fixture 103 and a controllable lighting load 104 that is installed in a table lamp 105. The lighting loads 102, 104 shown in FIG. 1 may include light sources of different types (e.g., incandescent lamps, fluorescent lamps, and/or LED light sources). The lighting loads may have advanced features. For example, the lighting loads may be controlled to emit light of varying intensities and/or colors in response to a user command.

The lighting control system 100 may include one or more control devices for controlling the lighting loads 102, 104 (e.g., controlling an amount of power delivered to the lighting loads). The lighting loads 102, 104 may be controlled substantially in unison, or be controlled individually. For example, the lighting loads may be zoned so that the lighting load 102 may be controlled by a first control device, while the lighting load 104 may be controlled by a second control device. The control devices may be configured to turn the lighting loads 102, 104 on and off. The control devices may be configured to control the magnitude of a load current conducted through the lighting loads so as to control an intensity of the lighting loads 102, 104 between a low-end intensity $L_{LE}$ and a high-end intensity $L_{HE}$, for example.

The control device described herein may be, for example, a dimmer switch 110, a retrofit remote control device 112, a wall-mounted control device 114, a tabletop remote control device 116, and/or a handheld remote control device 118. The dimmer switch 110 may be configured to be mounted to a standard electrical wallbox (e.g., via a yoke) and be coupled in series electrical connection between a power source (e.g., an alternating-current (AC) power source 105 or a direct-current (DC) power source) and a lighting load that is wired into the control path of the dimmer switch 110 (e.g., such as the lighting load 102). The dimmer switch 110 may receive an AC mains line voltage $V_{AC}$ from the AC power source 105, and may generate a control signal for controlling the lighting load 102. The control signal may be generated via various phase-control techniques (e.g., a forward phase-control dimming technique or a reverse phase-control dimming technique). The dimmer switch 110 may be configured to receive wireless signals (e.g., from a remote control device) representative of commands to control the lighting load 102 (e.g., the intensity and/or color of the lighting load), and generate respective control signals for executing the commands. Examples of wall-mounted dimmer switches are described in greater detail in commonly-assigned U.S. Pat. No. 7,242,150, issued Jul. 10, 2007, entitled DIMMER HAVING A POWER SUPPLY MONITORING CIRCUIT; U.S. Pat. No. 7,546,473, issued Jun. 9, 2009, entitled DIMMER HAVING A MICROPROCESSOR-CONTROLLED POWER SUPPLY; and U.S. Pat. No. 8,664,881, issued Mar. 4, 2014, entitled TWO-WIRE DIMMER SWITCH FOR LOW-POWER LOADS, the entire disclosures of which are hereby incorporated by reference.

The retrofit remote control device 112 may be configured to be mounted to a mechanical switch (e.g., a toggle switch 122, a paddle switch, a pushbutton switch, a "light switch," or other suitable switch) that may be pre-existing in the lighting control system 100. Such a retrofit solution may provide energy savings and/or advanced control features, for example without requiring significant electrical re-wiring and/or without requiring the replacement of existing mechanical switches. As an example, a consumer may replace an existing lamp with the controllable lighting load 104, switch a toggle switch 122 that is coupled to the lighting load 104 to the on position, install (e.g., mount) the remote control device 112 onto the toggle switch 122, and associate the remote control device 112 with the lighting source 104. The retrofit remoted control 112 may then be used to perform advanced functions that the toggle switch 122 may be incapable of performing (e.g., such as dimming the intensity level of the light output, providing feedback to a user, etc.). As shown, the toggle switch 122 is coupled (e.g., via a series electrical connection) between the AC power source 105 and an electrical receptacle 120 into which the lighting load 104 may be plugged (e.g., as shown in FIG. 1). Alternative, the toggle switch 122 may be coupled between the AC power source 105 and one or more of the lighting loads 102, 104, without the electrical receptacle 120. The retrofit remote control device 112 may be operable to transmit the wireless signals to the controllable light source 104 for controlling the intensity and/or color (e.g., color temperature) of the controllable light source 104. The remote control device 112 may also be configured to transmit wireless signals for control of other electrical loads, such as for example, the volume of a speaker and/or audio system, the position of a motorized window treatment, the setpoint temperature of a heating and/or cooling system, and/or a controllable characteristic of another electrical load or device.

The wall-mounted remote control device 114 may be configured to be mounted to a standard electrical wallbox and be electrically connected to the AC power source 105 for receiving power. The wall-mounted remote control device 114 may be configured to receive a user input and may generate and transmit a control signal (e.g., control data such as a digital message) for controlling the lighting loads 102, 104 in response to the user input. The tabletop remote control device 116 may be configured to be placed on a surface (e.g., an end table or night stand), and may be powered by a direct-current (DC) power source (e.g., a battery or an external DC power supply plugged into an electrical outlet). The tabletop remote control device 116 may be configured to receive a user input, and may generate and transmit a signal (e.g., a digital message) for controlling the lighting loads 102, 104 in response to the user input. The handheld remote control device 118 may be sized to fit into a user's hand, and may be powered by a direct-current (DC) power source (e.g., a battery or an external DC power supply plugged into an electrical outlet). The handheld remote control device 118 may be configured to receive a user input, and may generate and transmit a signal (e.g., a digital message) for controlling the lighting loads 102, 104 in response to the user input. Examples of battery-powered remote controls are described in greater detail in commonly assigned U.S. Pat. No. 8,330,638, issued Dec. 11, 2012, entitled WIRELESS BATTERY POWERED REMOTE CONTROL HAVING MULTIPLE MOUNTING MEANS, the entire disclosure of which is hereby incorporated by reference.

The control devices described herein (e.g., the dimmer switch 110 and/or remote control devices 112-118) may each include one or more light sources (e.g., LEDs) configured to be illuminated to provide feedback to a user of the control device. Such feedback may indicate, for example, a status of the lighting loads 102, 104 such as whether the lighting loads are on or off, a present intensity of the lighting loads, and so on. The feedback may indicate a status of the control device itself such as a power status of the control device (e.g., remaining battery power). The feedback may indicate to the user that the control device is transmitting control signals (e.g., RF signals) in response to an actuation of the control device. The control device may be configured to keep the one or more light sources illuminated while the condition triggering the feedback continues to exist. The control device may be configured to illuminate the one or more light sources for a few seconds (e.g., 1-2 seconds) and then turn off the light sources (e.g., to conserve battery life).

The control devices may be configured to be dim (e.g., not illuminated) the one or more light sources so that no feedback is provided when the control devices are in an idle state. The control devices may then illuminate the one or more light sources to provide the feedback in response to detecting a user within close proximity of the control devices. Such detection may be based on, for example, a finger hovering near a front surface of the control devices. The presence of the user may be detected, for example, via a capacitive touch element or an electrical field sensor comprised in the control devices.

The control devices may each include a control circuit. The control circuit may be configured to be responsive to a user input and generate control data (e.g., a control signal) for controlling the lighting loads 102, 104 based on the user input. The control data may include commands and/or other information (e.g., such as identification information) for controlling the lighting loads 102, 104. The control circuit may be configured to illuminate the one or more light sources to provide the feedback described herein.

One or more of the control devices may include a wireless communication circuit (e.g., a radio frequency (RF) transmitter) operable to transmit and/or receive wireless signals such as RF signals 108. The wireless signal may be used to transmit control data (e.g., a digital message) generated by the control devices to the lighting loads 102, 104 or to a central controller of the lighting control system 100, for example. The lighting loads 102, 104 may be associated with a control device during a configuration procedure such that the lighting loads 102, 104 may be responsive to control signals transmitted by the control device. To illustrate, the association may be accomplished by actuating an actuator on the concerned lighting loads, and then actuating (e.g., pressing and holding) an actuator on the control device for a predetermined amount of time (e.g., approximately 10 seconds). Examples of a configuration procedure for associating a control device with an electrical load is described in greater detail in commonly-assigned U.S. Patent Publication No. 2008/0111491, published May 15, 2008, entitled RADIO-FREQUENCY LIGHTING CONTROL SYSTEM, the entire disclosure of which is hereby incorporated by reference.

The control devices may each include a memory. The memory may be used, for example, to store operational settings associated with the control device and/or the lighting loads 102, 104. The memory may be implemented as an external integrated circuit (IC) or as an internal circuit (e.g., as part of a control circuit).

The load control system 100 may include one or more of a remote occupancy sensor or a remote vacancy sensor (not shown) for detecting occupancy and/or vacancy conditions in a space surrounding the sensors. The occupancy or vacancy sensors may be configured to transmit digital messages to the lighting loads 102, 104 (e.g., via the RF signals 108) in response to detecting occupancy or vacancy conditions. Examples of RF load control systems having occupancy and vacancy sensors are described in greater detail in commonly-assigned U.S. Pat. No. 8,009,042, issued Aug. 30, 2011, entitled RADIO FREQUENCY LIGHTING CONTROL SYSTEM WITH OCCUPANCY SENSING, the entire disclosure of which is hereby incorporated by reference.

The load control system 100 may include a remote daylight sensor (not shown) for measuring a total light intensity in the space around the daylight sensor. The daylight sensor may be configured to transmit digital messages, such as a measured light intensity, to the lighting loads 102, 104 such that the lighting loads may be operable to adjust their respective intensities in response to the measured light intensity. Examples of RF load control systems having daylight sensors are described in greater detail in commonly assigned U.S. Pat. No. 8,451,166, issued May 28, 2013, entitled WIRELESS BATTERY-POWERED DAYLIGHT SENSOR, the entire disclosure of which is hereby incorporated by reference.

The load control system 100 may include other types of input devices, for example, radiometers, cloudy-day sensors, temperature sensors, humidity sensors, pressure sensors, smoke detectors, carbon monoxide detectors, air-quality sensors, security sensors, proximity sensors, fixture sensors, partition sensors, keypads, kinetic or solar-powered remote controls, key fobs, cell phones, smart phones, tablets, personal digital assistants, personal computers, laptops, time clocks, audio-visual controls, safety devices, power monitoring devices (such as power meters, energy meters, utility submeters, utility rate meters), central control transmitters, residential, commercial, or industrial controllers, or any combination of these input devices.

It should be further appreciated that although FIG. 1 depicts a load control system with two lighting loads, the system may include more lighting loads, other types of lighting loads, and/or other types of electrical loads. For example, the load control system may include one or more of the following: a dimming ballast for driving a gas-discharge lamp; an LED driver for driving an LED light source; a dimming circuit for controlling the intensity of a lighting load; a screw-in luminaire including a dimmer circuit and an incandescent or halogen lamp; a screw-in luminaire including a ballast and a compact fluorescent lamp; a screw-in luminaire including an LED driver and an LED light source; an electronic switch, controllable circuit breaker, or other switching device for turning an appliance on and off; a plug-in load control device, controllable electrical receptacle, or controllable power strip for controlling one or more plug-in loads; a motor control unit for controlling a motor load, such as a ceiling fan or an exhaust fan; a drive unit for controlling a motorized window treatment or a projection screen; one or more motorized interior and/or exterior shutters; a thermostat for a heating and/or cooling system; a temperature control device for controlling a setpoint temperature of a heating, ventilation, and air-conditioning (HVAC) system; an air conditioner; a compressor; an electric baseboard heater controller; a controllable damper; a variable air volume controller; a fresh air intake controller; a ventilation controller; one or more hydraulic valves for use in radiators and radiant heating system; a humidity control unit; a humidifier; a dehumidifier; a water heater; a boiler controller; a pool pump; a refrigerator; a freezer; a television and/or computer monitor; a video camera; a volume control; an audio system or amplifier; an elevator; a power supply; a generator; an electric charger, such as an electric vehicle charger; an alternative energy controller; and/or the like.

Figure 4:
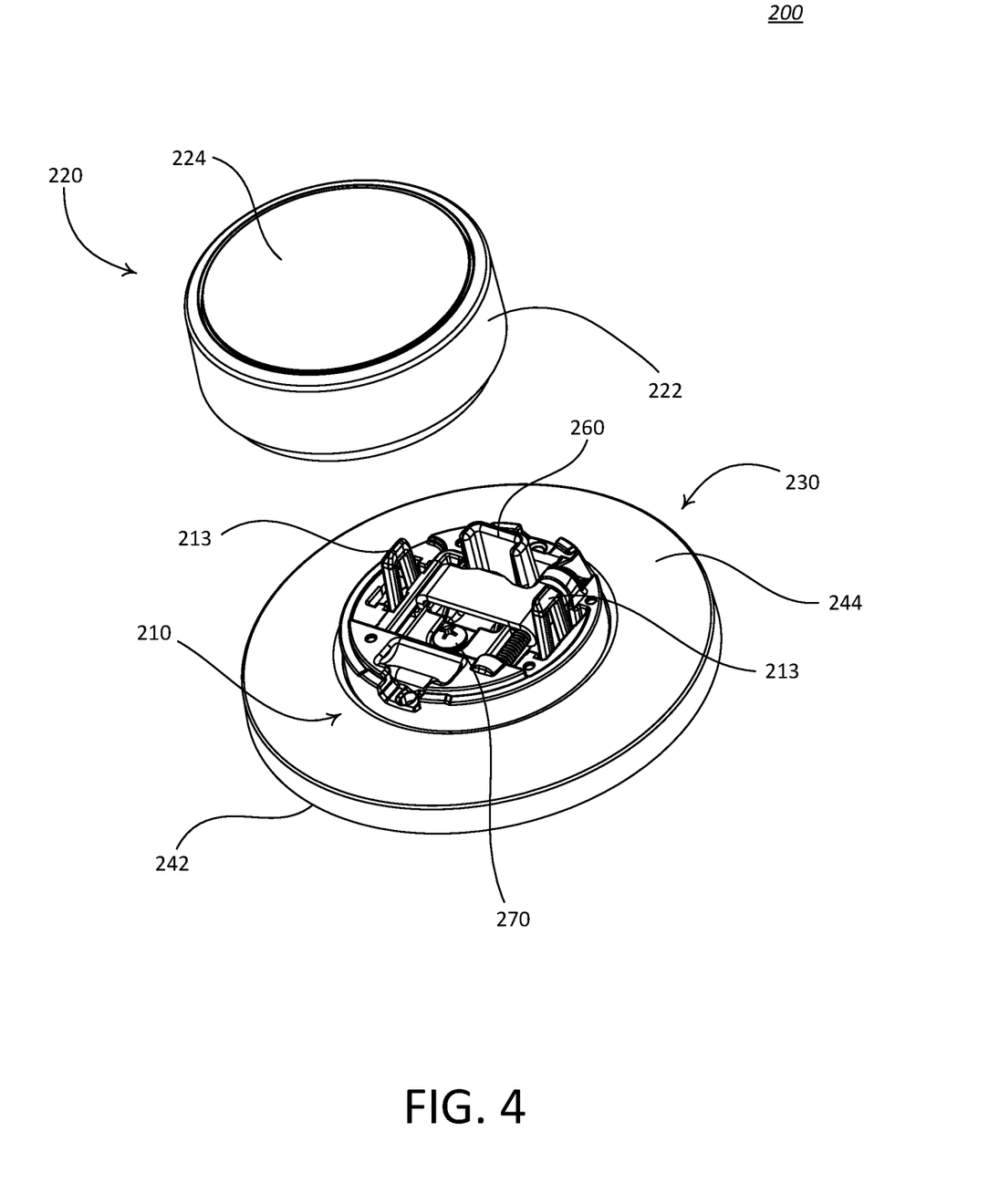
FIG. 4 is a partially exploded view of the example remote control device of FIG. 2.
Figure 5:
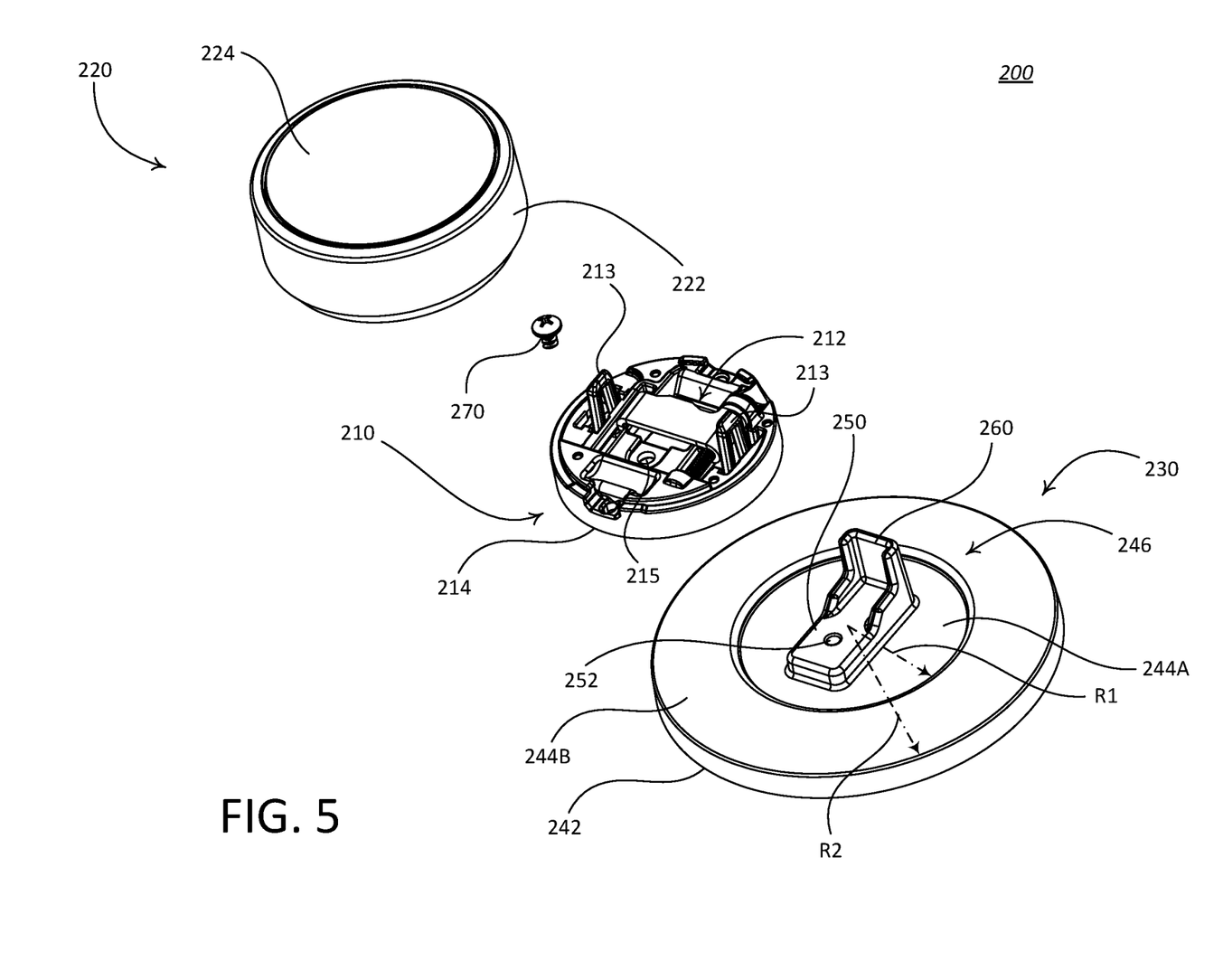
FIG. 5 is another partially exploded view of the example control device of FIG. 2.

FIGS. 2-5 illustrate an example remote control device 200 attached to a pedestal 230. The remote control device 200 may be deployed as the tabletop remote control device 116 in the load control system 100 (e.g., as shown in FIG. 1). The remote control device 200 may be configured to control the amount of power delivered to, and thus the intensity of, at least one lighting load. The remote control device 200 may include a base 210 and a control unit 220 that may be attached to the base 210. The base 210 may alternatively be referred to as a base portion or a mounting assembly. The control unit 220 may alternatively be referred to as a control module. It should be appreciated that other control units described herein may similarly be alternatively referred to as control modules. The control unit 220 may include a rotating portion that is rotatable with respect to the base 210. For example, as shown, the control unit 220 includes an annular rotating portion 222 that is configured to rotate about the base 210. The control unit 220 may include an actuation portion 224, which may be operated separately from or in concert with the rotating portion 222. The remote control device 200 may be configured such that the control unit 220 and the base 210 are removably attachable to one another. FIG. 4 depicts the remote control device 200 with the control unit 220 detached from the base 210.

The base 210 may define an opening 212 that extends therethrough and that is configured to receive at least a portion of the pedestal 230. The base 210 may define a rear surface 214.

The pedestal 230 may be a mount that is configured to rest on a horizontal surface. The pedestal 230 may be configured to receive the remote control device 200. For example, the remote control device 200 may be mounted to the pedestal 230. The pedestal 230 may include a plate 240, a platform 250, and a mounting tab 260. The plate 240 may be configured to rest on a horizontal surface. For example, the plate 240 may define a rear surface 242 that is configured to abut the horizontal surface. The plate 240 may define an upper face 244. The plate 240 may be circular.

The plate 240 (e.g., the upper face 244) may define a first portion 244A (e.g., a first upper surface) and a second portion 244B (e.g., a second upper surface). The first portion 244A may be defined between a center of the plate 240 and a first radius R1 from the center of the plate 240. The second portion 244B may be defined between the first radius R1 and a second radius R2 from the center of the plate 240. The first portion 244A and the second portion 244B may define a cavity 246. For example, a difference between the first portion 244A and the second portion 244B may define the cavity 246. The cavity 246 may be configured to receive a portion of the remote control device 200. The remote control device 200 (e.g., the rear surface 214 of the base 210) may abut the first portion 244A when received by the cavity 246.

Alternatively, the plate 240 (e.g., the upper face 244) may define a first thickness at the first radius R1 from the center of the plate 240. The plate 240 may define a second thickness between the first radius R1 and the second radius R2 from the center of the plate 240. The second thickness may be greater than the first thickness. A difference between the first thickness and the second thickness may define the cavity 246. The cavity 246 may be configured to receive a portion of the remote control device 200. Stated differently, the first portion 244A (e.g., the first upper surface) may define the first thickness and the second portion 244B (e.g., the second upper surface) may define the second thickness.

The platform 250 may extend from the plate 240 (e.g., the upper face 244). For example, the platform 250 may extend from the first portion 244A of the upper face 244. A midpoint of the platform 250 may be located slightly offset from the center of the plate 240. For example, the platform 250 may be offset from the center of the plate 240 such that the remote control device 200 is centered on the plate 240 when secured to the pedestal 230. The platform 250 may include an aperture 252.

The mounting tab 260 may extend from the platform 250. The mounting tab 260 may extend into the opening 212 defined by the base 210. The mounting tab 260 may be configured to prevent rotation of the remote control device 200 (e.g., the base 210) when the base 210 is attached to the pedestal 230. For example, the mounting tab 260 may be configured to prevent rotation of the base 210 when the rotating portion 222 is rotated. The remote control device 200 may include a fastener 270. The fastener 270 may be configured to secure the remote control device 200 to the pedestal 230. For example, the fastener 270 may be configured to secure the base 210 to the platform 250. The aperture 252 may receive the fastener 270, for example, to secure the remote control device 200 (e.g., the base 210) to the pedestal 230. The fastener 270 may be self-threading. For example, the aperture 252 may be sized such that the fastener 270 secures the base 210 to the platform 250. Alternatively, the aperture 252 may be threaded such that the aperture 252 has complimentary threads to those of the fastener 270. The base 210 may define a through-hole 215 that is configured to receive the fastener 270.

Figure 6:
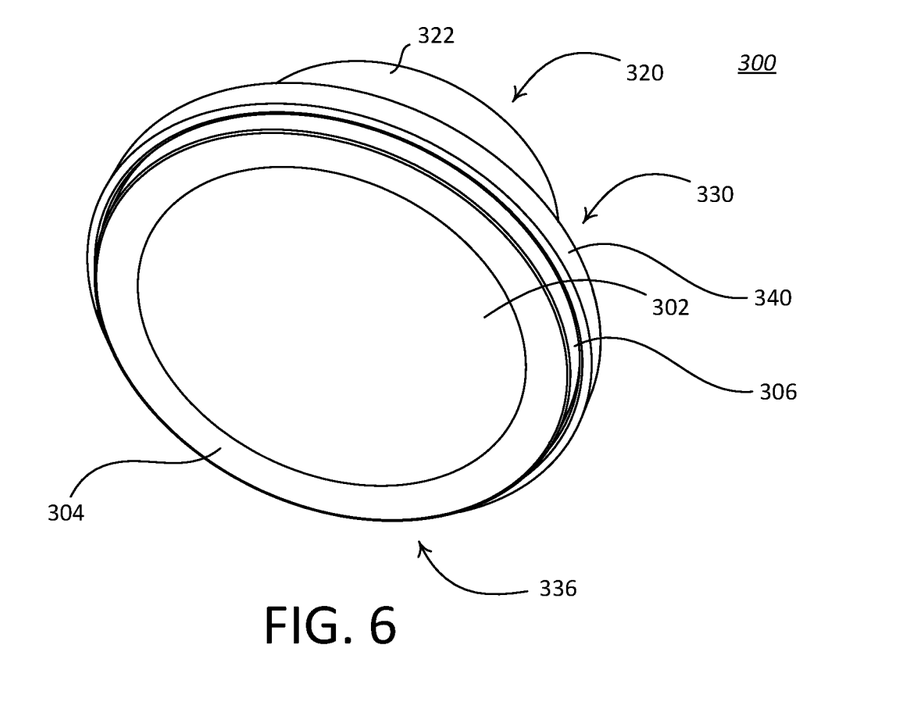
FIG. 6 is a rear perspective view of another example remote control device that may be deployed as a dimmer switch of the load control system illustrated in FIG. 1.
Figure 7:
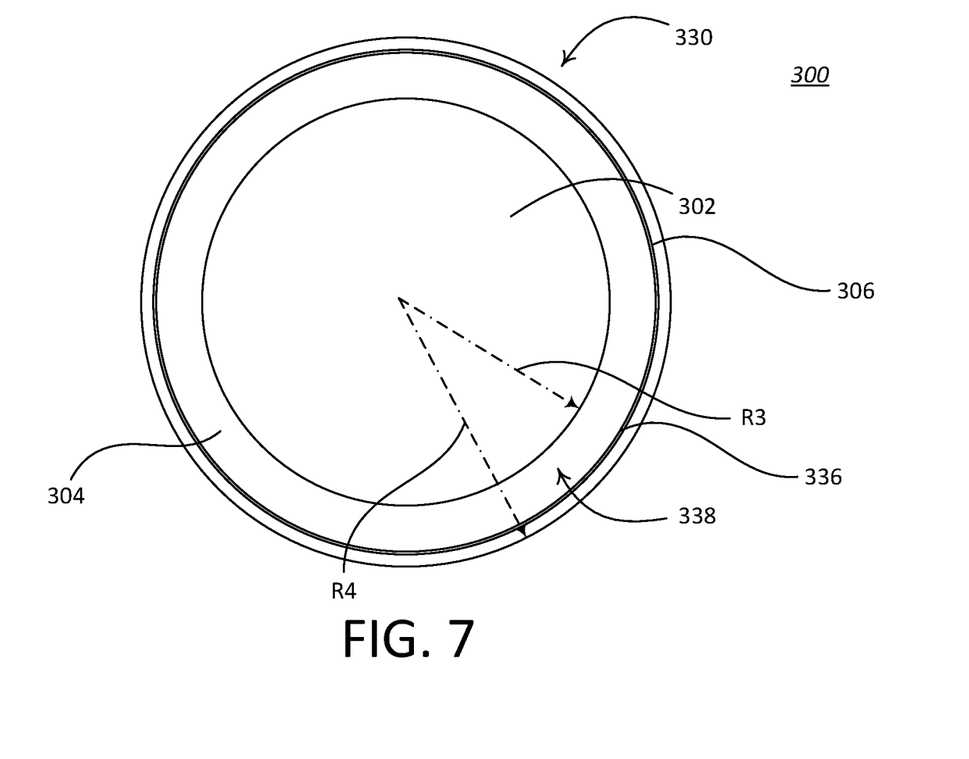
FIG. 7 is a rear view of the example remote control device of FIG. 6.
Figure 8:
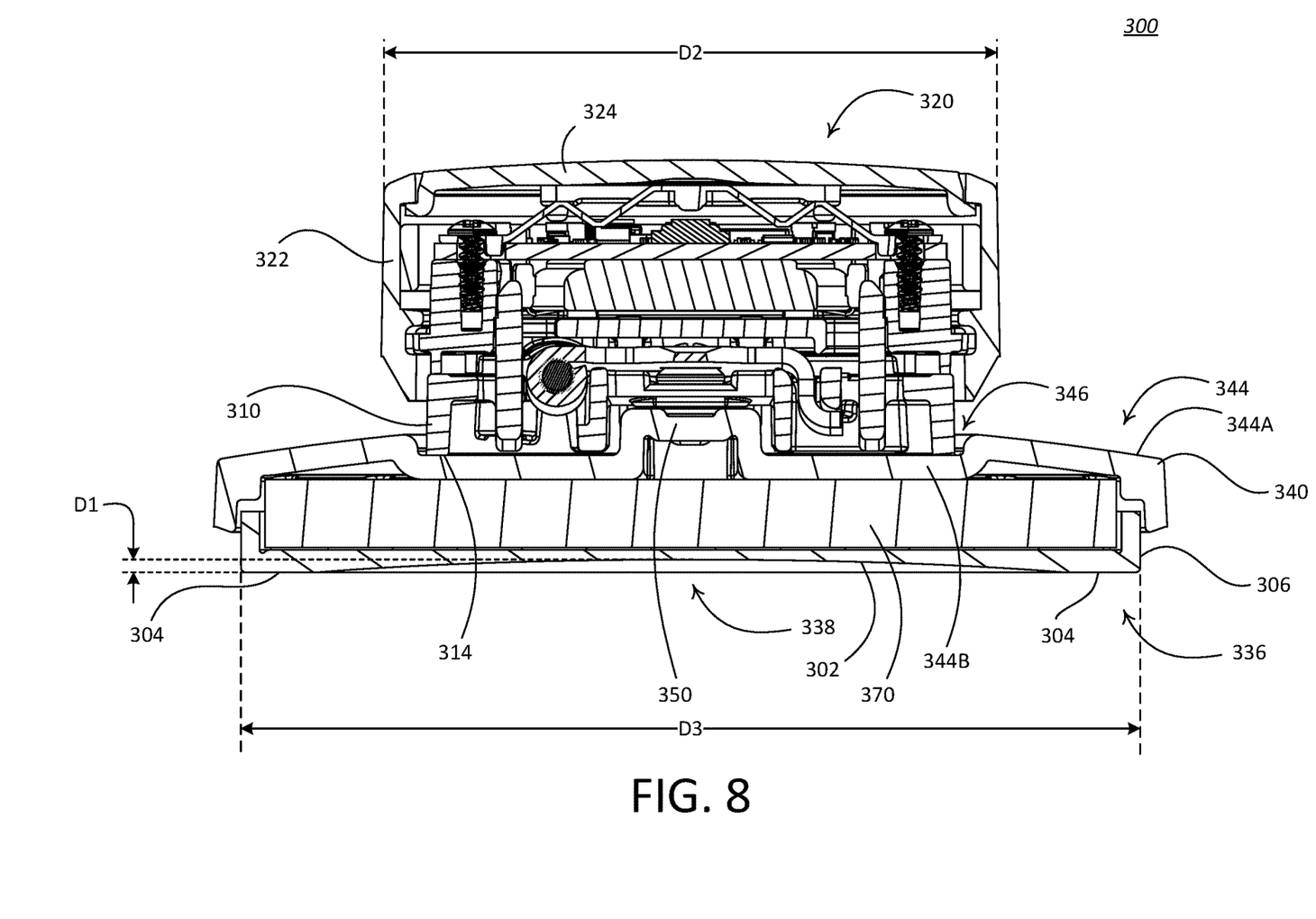
FIG. 8 is a cross-section view of the example control device of FIG. 6.

FIGS. 6-8 illustrate another example remote control device 300 having a pedestal 330 (e.g., such as the remote control device 200). The pedestal 330 may be configured to be attached to the remote control device 300. The remote control device 300 may be deployed as the tabletop remote control device 116 in the load control system 100 (e.g., as shown in FIG. 1). The remote control device 300 may be configured to control the amount of power delivered to, and thus the intensity of, at least one lighting load. The remote control device 300 may include a base 310 and a control unit 320 that may be attached to the base 310. The base 310 may alternatively be referred to as a base portion or a mounting assembly. The control unit 320 may alternatively be referred to as a control module. It should be appreciated that other control units described herein may similarly be alternatively referred to as control modules. The control unit 320 may include a rotating portion 322 that is rotatable with respect to the base 310 (e.g., an annular rotating portion that is configured to rotate about the base). The control unit 320 may include an actuation portion 324, which may be operated separately from or in concert with the rotating portion 322. The remote control device 300 may be configured such that the control unit 320 and the base 310 are removably attachable to one another.

The pedestal 330 may be a mount that is configured to rest on a horizontal surface. The pedestal 330 may be configured to receive the control unit 320. For example, the base 310 may be mounted to the pedestal 330. The pedestal 330 may include a bottom plate 336, a top plate 340, a platform 350, and a mounting tab (e.g., such as mounting tab 260 shown in FIGS. 4 and 5). The bottom plate 336 may be circular. The bottom plate 336 may be attached to the top plate 340. For example, the pedestal 330 may include a weight 370. The weight 370 may be configured to increase the mass of the pedestal 330 and/or increase the torque resistance of the pedestal 330. The bottom plate 336 may surround a portion of the weight 370. The bottom plate 336 may be attached (e.g., using adhesive) to the weight 370. The weight 370 may be attached to the top plate 340. The weight 370 may be hidden from view by the top plate 340 and the bottom plate 336.

The bottom plate 336 may be configured to rest on a horizontal surface. The bottom plate 336 may be rubber, synthetic rubber, silicone, and/or the like. For example, the bottom plate 336 may define a bottom surface 338 that is configured to abut the horizontal surface. The bottom surface 338 may be concave. For example, the bottom surface 338 may include a recessed portion 302 and a flat portion 304. The flat portion 304 may be proximate to (e.g., along) an outer perimeter of the bottom plate 336. The flat portion 304 may be configured to rest on the horizontal surface. The recessed portion 302 may be spaced from the horizontal surface, for example, when the flat portion 304 rests on the horizontal surface. The recessed portion 302 may extend a distance D1 from the flat portion 304 (e.g., as shown in FIG. 8). The distance D1 may be at least 0.01 inches. The recessed portion 302 may be concave-shaped (e.g., as shown in FIG. 6).

The flat portion 304 may be configured to resist movement of the remote control device 300 with respect to the horizontal surface on which the bottom plate 336 (e.g., the flat portion) rests. The flat portion 304 may extend from the outer perimeter of the bottom plate 336 (e.g., outer edge 306) to a predetermined radius (e.g., radius R3 as shown in FIG. 7) from a center of the bottom plate 336. The outer perimeter of the bottom plate 336 may be defined by a radius R4. The predetermined radius R3 may be determined such that a surface area of bottom plate 336 contacting the horizontal surface is minimized while satisfying a frictional force threshold. For example, the frictional force that the bottom surface 338 can resist may be based on the predetermined radius R3. The predetermined radius R3 may be configured such that the pedestal 330 is configured to prevent movement of the pedestal 330 (e.g., with respect to the horizontal surface) when a torque is applied parallel to the flat portion 304. The bottom plate 336 may be configured such that a frictional surface area (e.g., the flat portion 304)

has a larger outer diameter (e.g., diameter D3) than an outer diameter (e.g., diameter D2) of the rotary knob 320 of the control unit 320.

The top plate 340 may define an upper face 330. The top plate 340 may be circular. The top plate 340 (e.g., the upper face 344) may define a first portion 344A (e.g., a first upper surface) and a second portion 344B (e.g., a second upper surface). The first portion 344A and the second portion 344B may define a cavity 346. For example, a difference between the first portion 344A and the second portion 344B may define the cavity 346. The cavity 346 may be configured to receive a portion of the remote control device 300. The remote control device 300 (e.g., the rear surface 314 of the base 310) may abut the first portion 344A, when the remote control device 300 is received by the cavity 346.

The platform 350 may extend from the top plate 340 (e.g., the upper face 344). For example, the platform 350 may extend from the first portion 344A of the upper face 344. The platform 350 may be configured to prevent rotation of the remote control device 300 (e.g., the base 310) when the rotating portion 322 is rotated. The remote control device 300 may include a fastener (e.g., the fastener 270) that is configured to secure the base 310 to the pedestal 330.

Figure 9:
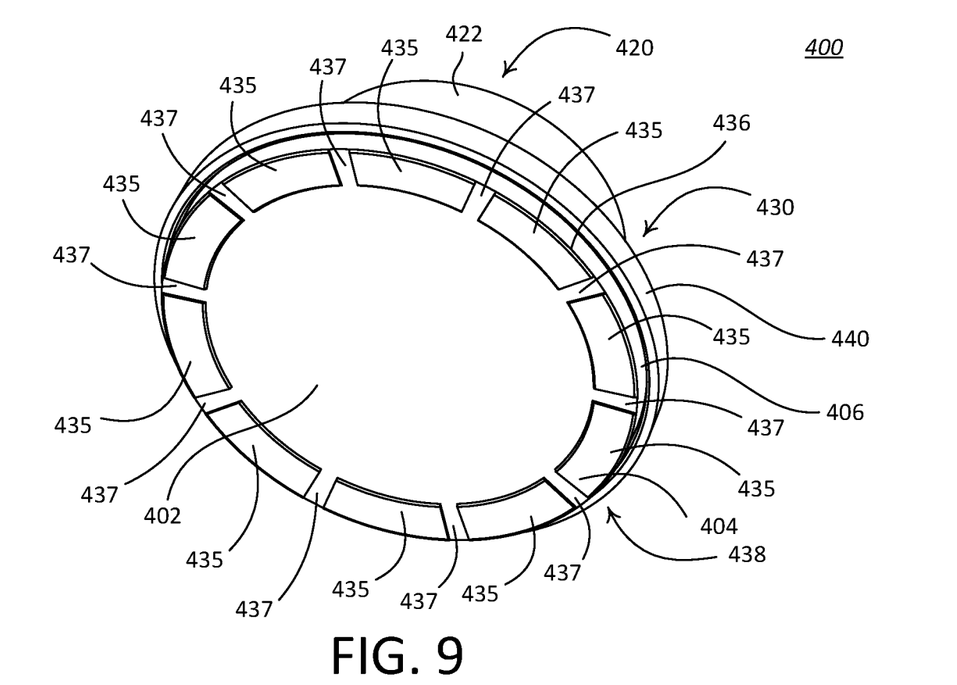
FIG. 9 is a rear perspective view of another example remote control device that may be deployed as a dimmer switch of the load control system illustrated in FIG. 1.
Figure 10:
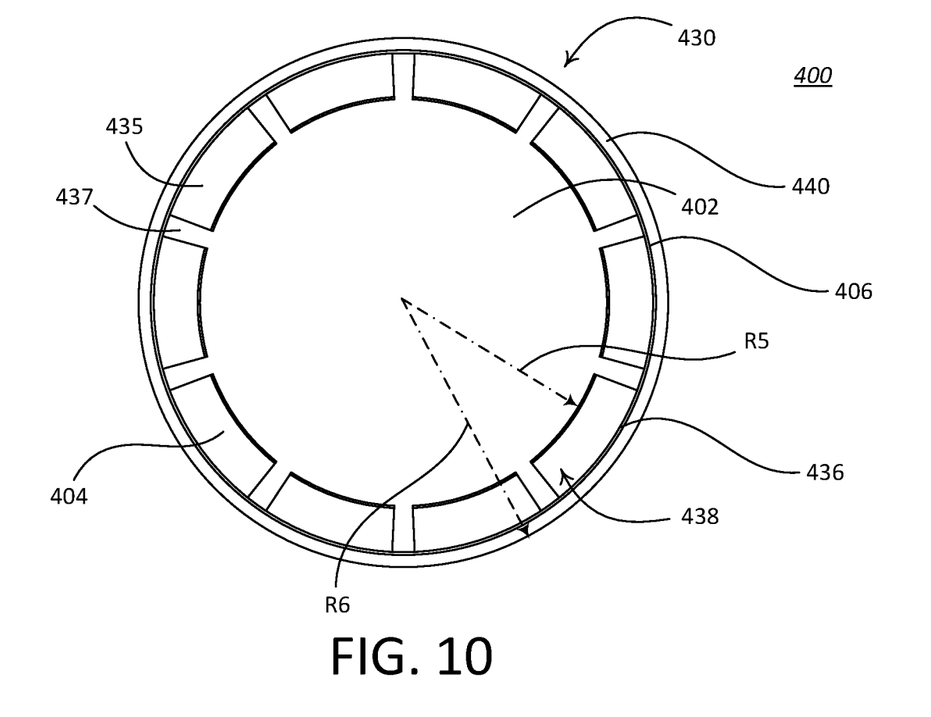
FIG. 10 is a rear view of the example remote control device of FIG. 9.
Figure 11:
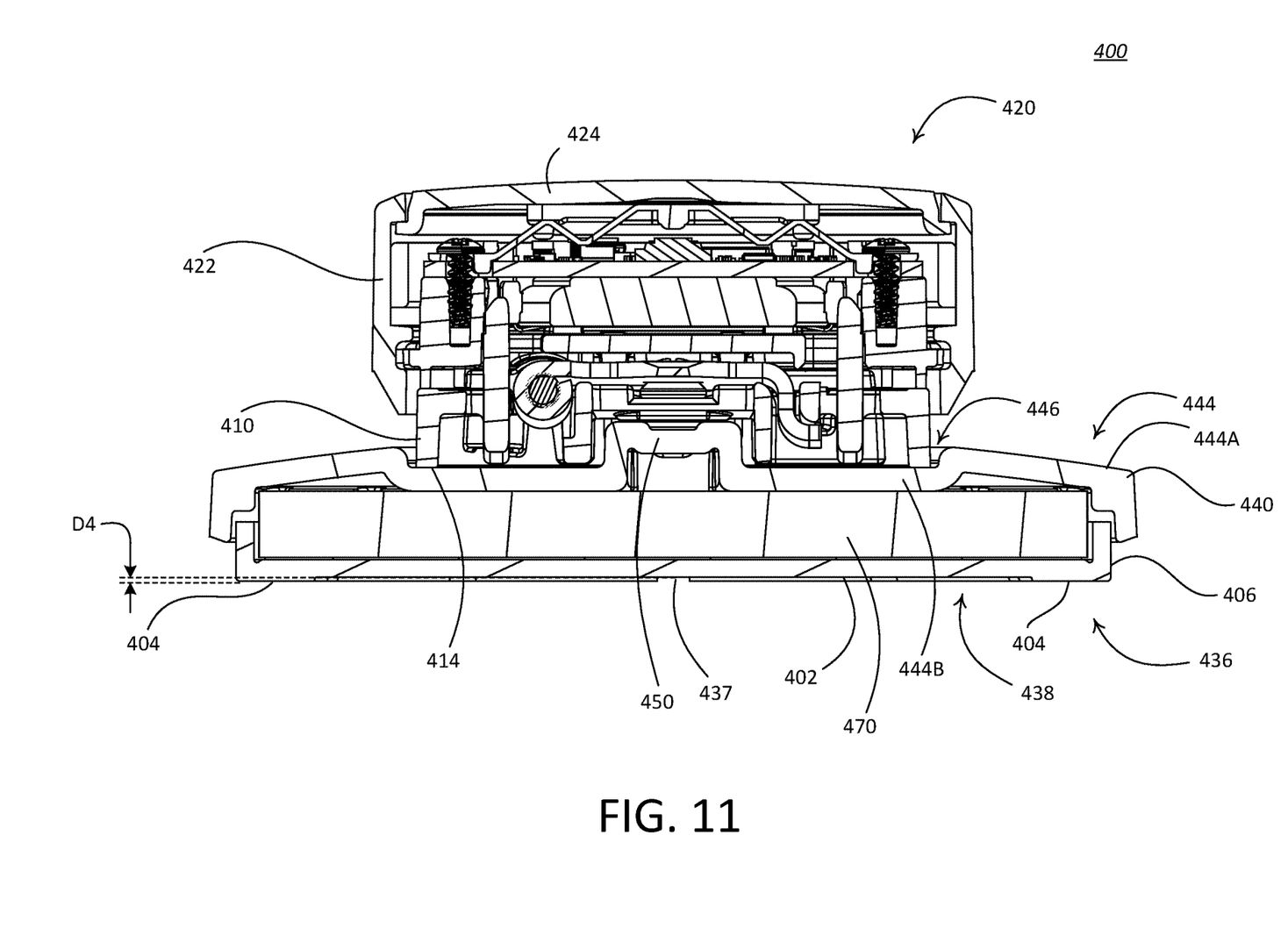
FIG. 11 is a cross-section view of the example control device of FIG. 9.

FIGS. 9-11 illustrate another example remote control device 400 having a pedestal 430 (e.g., such as the remote control device 200). The pedestal 430 may be configured to be attached to the remote control device 400. The remote control device 400 may be deployed as the tabletop remote control device 116 in the load control system 100 (e.g., as shown in FIG. 1). The remote control device 400 may be configured to control the amount of power delivered to, and thus the intensity of, at least one lighting load. The remote control device 400 may include a base 410 and a control unit 420 that may be attached to the base 410. The base 410 may alternatively be referred to as a base portion or a mounting assembly. The control unit 420 may alternatively be referred to as a control module. It should be appreciated that other control units described herein may similarly be alternatively referred to as control modules. The control unit 420 may include a rotating portion 422 that is rotatable with respect to the base 410 (e.g., an annular rotating portion that is configured to rotate about the base). The control unit 420 may include an actuation portion 424, which may be operated separately from or in concert with the rotating portion 422. The remote control device 400 may be configured such that the control unit 420 and the base 410 are removably attachable to one another.

The pedestal 430 may be a mount that is configured to rest on a horizontal surface. The pedestal 430 may be configured to receive the control unit 420. For example, the base 410 may be mounted to the pedestal 430. The pedestal 430 may include a bottom plate 436, a top plate 440, a platform 450, and a mounting tab (e.g., such as mounting tab 260 shown in FIGS. 4 and 5). The bottom plate 436 may be circular. The bottom plate 436 may be attached to the top plate 440. For example, the pedestal 430 may include a weight 470. The weight 470 may be configured to increase the mass of the pedestal 430 and/or increase the torque resistance of the pedestal 430. The bottom plate 436 may surround a portion of the weight 470. The bottom plate 436 may be attached (e.g., using adhesive) to the weight 470. The weight 470 may be attached to the top plate 440. The weight 470 may be hidden from view by the top plate 440 and the bottom plate 436.

The bottom plate 436 may be configured to rest on a horizontal surface. The bottom plate 436 may be rubber, synthetic rubber, silicone, and/or the like. For example, the bottom plate 436 may define a bottom surface 438 that is configured to abut the horizontal surface. The bottom surface 438 may be concave. For example, the bottom surface 438 may include a recessed portion 402 and a flat portion 404. The flat portion 404 may be proximate to (e.g., along) an outer perimeter of the bottom plate 436. The flat portion 404 may be configured to rest on the horizontal surface. The recessed portion 402 may be spaced from the horizontal surface, for example, when the flat portion 404 rests on the horizontal surface. The recessed portion 402 may extend a distance D4 from the flat portion 404 (e.g., as shown in FIG. 11). The distance D4 may be at least 0.01 inches. The recessed portion 402 may be flat. Alternatively, the recessed portion 402 may be concave shaped.

The flat portion 404 may include a plurality of protrusions 435 around the outer perimeter of the bottom plate 436. The protrusions 435 may extend from the recessed portion 402. The protrusions 435 may be separated by respective channels 437. Each of the channels 437 may separate adjacent protrusions 435. The channels 437 may be part of the recessed portion 402. For example, the channels 437 may be formed when the protrusions are applied to the bottom plate 436. The protrusions 435 may be configured to rest on (e.g., abut) the horizontal surface. It should be appreciated that although the protrusions 435 are depicted in FIGS. 9 and 10 as sections of an outer disk, the protrusions 435 could be other shapes as well (e.g., such as circles, triangles, etc.).

The flat portion 404 may extend from the outer perimeter of the bottom plate 436 (e.g., outer edge 406) to a predetermined radius (e.g., radius R5 as shown in FIG. 10) from a center of the bottom plate 436. The outer perimeter of the bottom plate 436 may be defined by a radius R6. The predetermined radius R5 may be determined such that a surface area of bottom plate 436 contacting the horizontal surface is minimized while satisfying a frictional force threshold. For example, the frictional force that the bottom surface 438 can resist may be based on the predetermined radius R5. The predetermined radius R5 (e.g., and the protrusions 435 and channels 437) may be configured such that the pedestal 430 is configured to prevent movement of the pedestal 430 (e.g., with respect to the horizontal surface) when a torque is applied parallel to the flat portion 304. The bottom plate 436 may be configured such that a frictional surface area (e.g., the flat portion 404) has a larger outer diameter than an outer diameter of the rotary knob 420 of the control unit 420.

The top plate 440 may define an upper face 430. The top plate 440 may be circular. The top plate 440 (e.g., the upper face 444) may define a first portion 444A (e.g., a first upper surface) and a second portion 444B (e.g., a second upper surface). For example, a difference between the first portion 444A and the second portion 444B may define the cavity 446. The cavity 446 may be configured to receive a portion of the remote control device 400. The remote control device 400 (e.g., the rear surface 414 of the base 410) may abut the first portion 444A, when the remote control device 400 is received by the cavity 446.

The platform 450 may extend from the top plate 440 (e.g., the upper face 444). For example, the platform 450 may extend from the first portion 444A of the upper face 444. The platform 450 may be configured to prevent rotation of the remote control device 400 (e.g., the base 410) when the rotating portion 422 is rotated. The remote control device 400 may include a fastener (e.g., the fastener 270) that is configured to secure the base 410 to the pedestal 430.

FIGS. 12-15 illustrate another example remote control device 500 having a pedestal 530 (e.g., such as the remote control device 200). The pedestal 530 may be configured to be attached to the remote control device 500. The remote control device 500 may be deployed as the tabletop remote control device 116 in the load control system 100 (e.g., as shown in FIG. 1). The remote control device 500 may be configured to control the amount of power delivered to, and thus the intensity of, at least one lighting load. The remote control device 500 may include a base 510 and a control unit 520 that may be attached to the base 510. The base 510 may alternatively be referred to as a base portion or a mounting assembly. The control unit 520 may alternatively be referred to as a control module. It should be appreciated that other control units described herein may similarly be alternatively referred to as control modules. The control unit 520 may include a rotating portion that is rotatable with respect to the base 510 (e.g., an annular rotating portion that is configured to rotate about the base). The control unit 520 may include an actuation portion 524, which may be operated separately from or in concert with the rotating portion 522. The remote control device 400 may be configured such that the control unit 520 and the base 510 are removably attachable to one another.

The pedestal 530 may be a mount that is configured to rest on a horizontal surface. The pedestal 530 may be configured to receive the control unit 520. For example, the base 510 may be mounted to the pedestal 530. The pedestal 530 may include a bottom plate 536, a top plate 540, a platform 550, and a mounting tab (e.g., such as mounting tab 260 shown in FIGS. 4 and 5). The bottom plate 536 may be circular. The bottom plate 536 may be attached to the top plate 540. For example, the pedestal 530 may include a weight 570. The weight 570 may be configured to increase the mass of the pedestal 530 and/or increase the torque resistance of the pedestal 530. The bottom plate 536 may surround a portion of the weight 570. The bottom plate 536 may be attached (e.g., using adhesive) to the weight 570. The weight 570 may be attached to the top plate 540. The weight 570 may be hidden from view by the top plate 540 and the bottom plate 536.

The bottom plate 536 may be configured to rest on a horizontal surface. The bottom plate 536 may be rubber, silicone, and/or the like. For example, the bottom plate 536 may define a bottom surface 538 that is configured to abut the horizontal surface. The bottom surface 538 may be concave. For example, the bottom surface 538 may include a recessed portion 502 and a flat portion 504. The flat portion 504 may be proximate to (e.g., along) an outer perimeter of the bottom plate 536. The flat portion 504 may be configured to rest on the horizontal surface. The recessed portion 502 may be spaced from the horizontal surface, for example, when the flat portion 504 rests on the horizontal surface. The recessed portion 502 may extend a distance D5 from the flat portion 504 (e.g., as shown in FIG. 11). The distance D5 may be at least 0.01 inches. The recessed portion 502 may be flat. Alternatively, the recessed portion 502 may be concave shaped, for example, as shown in FIG. 11.

The flat portion 504 may include a plurality of notches 537. The notches 537 may be equally spaced around the perimeter of the bottom plate 536. The notches 537 may be configured to reduce the total surface area of the bottom plate 536 that abuts the horizontal surface. The notches 537 may extend beyond the flat portion 504 onto the recessed portion 502 of the bottom surface 538. For example, the notches 538 may extend from the outer edge 506 of the bottom plate 536 onto the recessed portion 502 to a predetermined radius R9. The notches 537 may taper from the outer edge 506 to the predetermined radius R9. For example, the notches 537 may be wider at the outer edge 506 than at the predetermined radius R9. It should be appreciated that although the notches 537 are shown (e.g., in FIGS. 12 and 13) extending to the outer edge 506, the notches 537 may not extend to the outer edge 506. For example, the notches 537 may extend from the predetermined radius R9 to a location on the flat portion 504 that is spaced from the outer edge 506.

Figure 13:
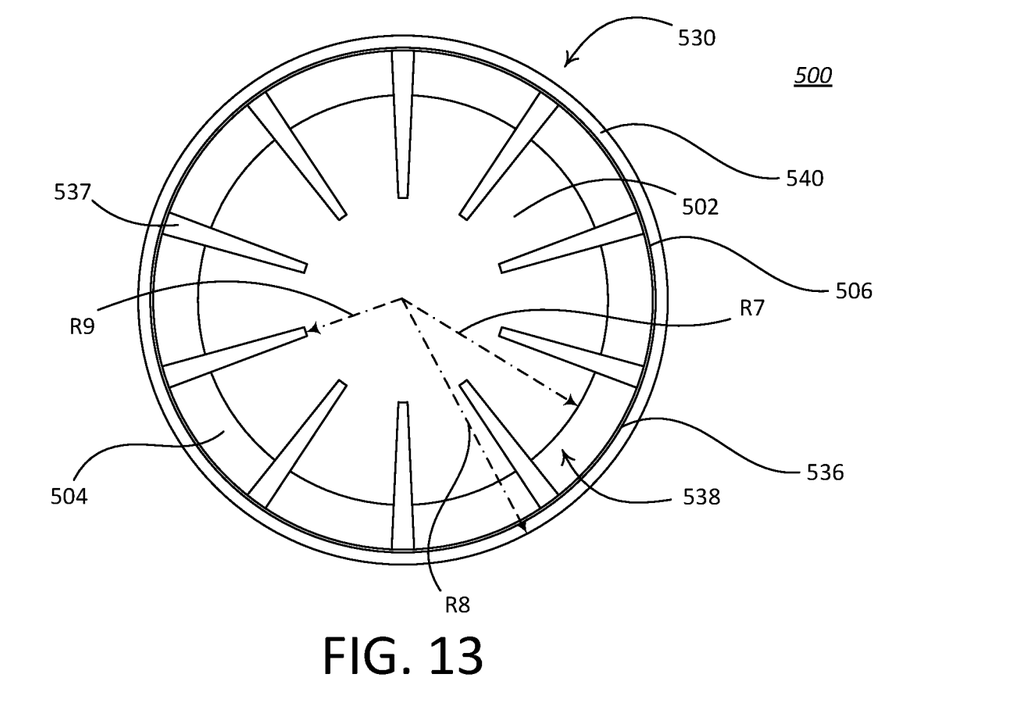
FIG. 13 is a rear view of the example remote control device of FIG. 12.

The flat portion 504 may extend from the outer perimeter of the bottom plate 536 (e.g., outer edge 506) to a predetermined radius (e.g., radius R7 as shown in FIG. 13) from a center of the bottom plate 536. The outer perimeter of the bottom plate 536 may be defined by a radius R8. The predetermined radius R7 may be determined such that a surface area of bottom plate 536 contacting the horizontal surface is minimized while satisfying a frictional force threshold. For example, the frictional force that the bottom surface 538 can resist may be based on the predetermined radius R7. The predetermined radius R7 (e.g., and the notches 537) may be configured such that the pedestal 530 is configured to prevent movement of the pedestal 530 (e.g., with respect to the horizontal surface) when a torque is applied parallel to the flat portion 304. The bottom plate 536 may be configured such that a frictional surface area (e.g., the flat portion 504) has a larger outer diameter than an outer diameter of the rotary knob 520 of the remote control device 500.

Figure 12:
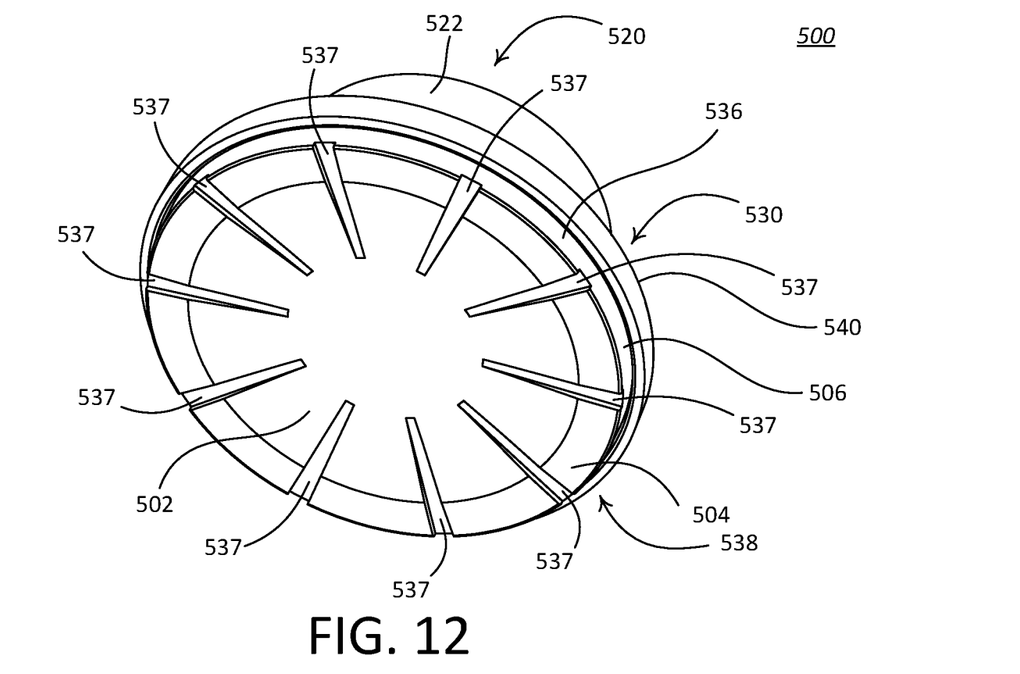
FIG. 12 is a rear perspective view of another example remote control device that may be deployed as a dimmer switch of the load control system illustrated in FIG. 1.
Figure 14:
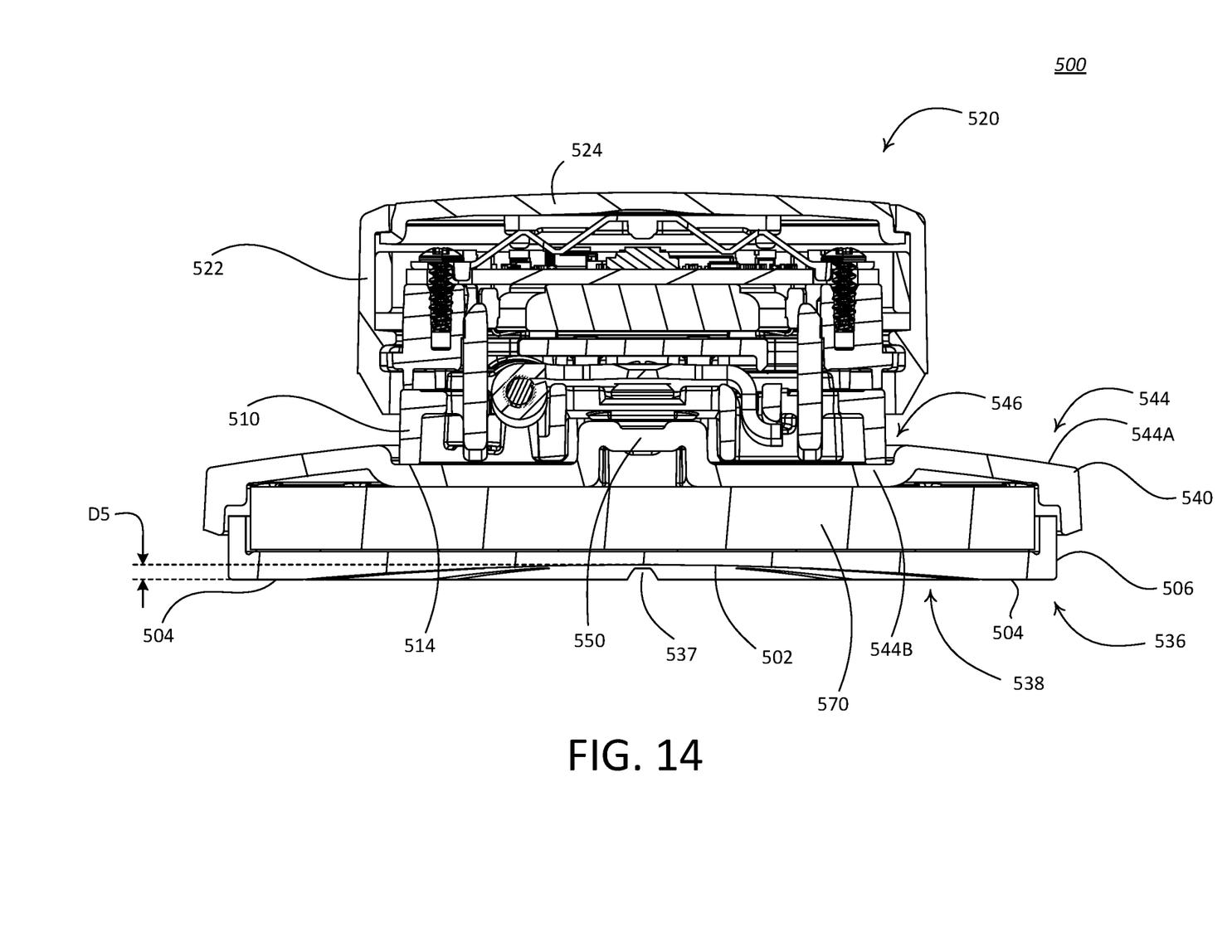
FIG. 14 is a cross-section view of the example control device of FIG. 12.

The top plate 540 may define an upper face 530. The top plate 540 may be circular. The top plate 540 (e.g., the upper face 544) may define a first portion 544A (e.g., a first upper surface) and a second portion 544B (e.g., a second upper surface). For example, a difference between the first portion 544A and the second portion 544B may define the cavity 546. The cavity 546 may be configured to receive a portion of the remote control device 500. The remote control device 500 (e.g., the rear surface 514 of the base 510) may abut the first portion 544A, when the remote control device 500 is received by the cavity 546.

The platform 550 may extend from the top plate 540 (e.g., the upper face 544). For example, the platform 550 may extend from the first portion 544A of the upper face 544. The platform 550 may be configured to prevent rotation of the remote control device 500 (e.g., the base 510) when the rotating portion 522 is rotated.

The remote control device 500 may include a fastener (e.g., the fastener 270 shown in FIGS. 4 and 5) that is configured to secure the remote control device 500 to the pedestal 530.

The invention claimed is:

1. A remote control device comprising:
a control unit that includes an attachment portion and a rotating portion that is configured to rotate relative to the attachment portion, the control unit comprises a wireless communication circuit and a control circuit configured to cause the wireless communication circuit to transmit a control signal in response to a rotation of the rotating portion;
a base to which the control unit is attachable, the base configured to releasably retain the control unit when the control unit is attached thereto, the base comprising a mechanism that is operable to cause the control unit to release from the base; and
a pedestal that is configured to rest on a horizontal surface, the pedestal comprising a top plate, and a bottom plate comprising a concave bottom surface, wherein the bottom plate is configured to prevent movement of the pedestal when the rotating portion of the control unit is rotated.

2. The remote control device of claim 1, wherein the concave bottom surface comprises a recessed portion and a flat portion along an outer perimeter of the bottom plate, wherein the flat portion is configured to rest on the horizontal surface.

3. The remote control device of claim 2, wherein the flat portion extends from the outer perimeter of the bottom plate to a predetermined radius.

4. The remote control device of claim 3, wherein the predetermined radius is configured such that the pedestal is configured to prevent movement of the pedestal when a torque is applied parallel to the flat portion.

5. The remote control device of claim 2, wherein the flat portion comprises a plurality of protrusions around the outer perimeter of the bottom plate.

6. The remote control device of claim 2, wherein the recessed portion extends at least 0.01 inches from the flat portion.

7. The remote control device of claim 2, wherein the flat portion comprises a plurality of notches.

8. The remote control device of claim 7, wherein each of the plurality of notches extends beyond the flat portion onto a recessed portion of the concave bottom surface.

9. The remote control device of claim 1, wherein the pedestal further comprises a platform that extends from the top plate, wherein the platform is configured to prevent rotation of the base of the when the base is attached to the pedestal and the control unit is mounted to the base.

10. The remote control device of claim 9, further comprising:
a fastener configured to secure the base to the pedestal, wherein the platform defines an aperture that is configured to receive the fastener.

11. The remote control device of claim 9, wherein the pedestal further comprises a mounting tab that extends from the platform, and wherein the mounting tab is configured to extend into an opening defined by the base, and wherein the mounting tab is configured to prevent the rotation of the base of the remote control device when the base is attached to the pedestal.

12. The remote control device of claim 1, wherein the bottom plate is circular.

* * * * *